United States Patent
Duan et al.

(10) Patent No.: US 7,223,616 B2
(45) Date of Patent: May 29, 2007

(54) TEST STRUCTURES IN UNUSED AREAS OF SEMICONDUCTOR INTEGRATED CIRCUITS AND METHODS FOR DESIGNING THE SAME

(75) Inventors: Franklin Duan, San Jose, CA (US); Maureen Ardans, Gresham, OR (US); Jun Song, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 424 days.

(21) Appl. No.: 10/862,049

(22) Filed: Jun. 4, 2004

(65) Prior Publication Data
US 2005/0272174 A1    Dec. 8, 2005

(51) Int. Cl.
G01R 31/26    (2006.01)
H01L 21/66    (2006.01)
H01L 23/58    (2006.01)
H01L 29/10    (2006.01)

(52) U.S. Cl. .................. 438/18; 257/48; 257/E21.531; 257/E21.523

(58) Field of Classification Search .................. 438/18; 257/48
See application file for complete search history.

(56) References Cited

U.S. PATENT DOCUMENTS

| | | | | |
|---|---|---|---|---|
| 5,981,302 | A * | 11/1999 | Alswede et al. | 438/15 |
| 6,146,908 | A * | 11/2000 | Falque et al. | 438/11 |
| 6,437,364 | B1 * | 8/2002 | Wu | 257/48 |
| 6,764,879 | B2 * | 7/2004 | Nagao et al. | 438/110 |
| 6,872,583 | B1 * | 3/2005 | Wu | 438/18 |
| 6,978,407 | B2 * | 12/2005 | Duan et al. | 714/721 |

* cited by examiner

Primary Examiner—David A. Zarneke
(74) Attorney, Agent, or Firm—Suiter Swantz PC LLC

(57) ABSTRACT

The present invention is test structures in unused areas of semiconductor integrated circuits and methods for designing the same. In an exemplary aspect of the present invention, a method for placing test structures in a semiconductor integrated circuit includes: (a) detecting a dummy area in a semiconductor integrated circuit, the semiconductor integrated circuit including probe pads on a top metal layer; (b) filling the dummy area with active test cells, the active test cells being connected to one another; and (c) connecting each of the active test cells to the probe pads with a metal line.

27 Claims, 9 Drawing Sheets

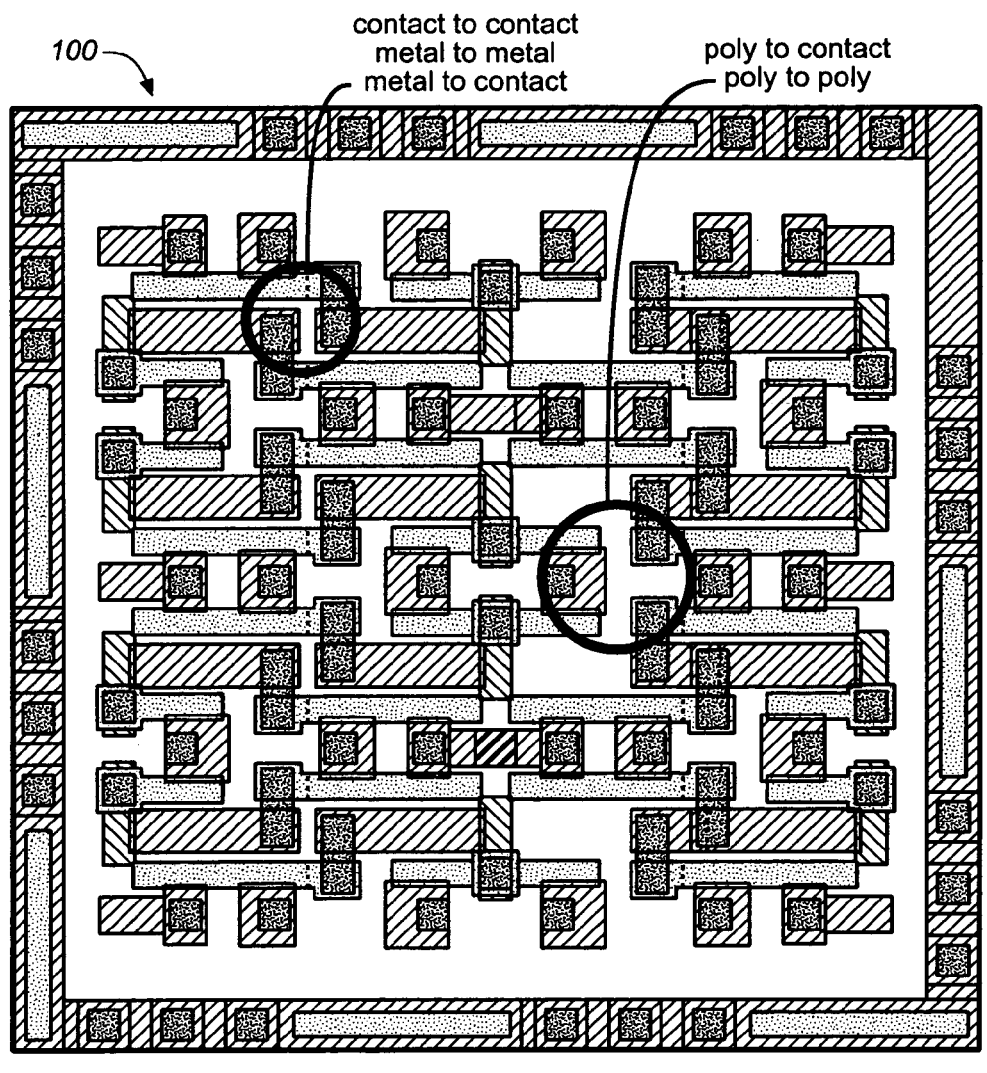
FIG._1

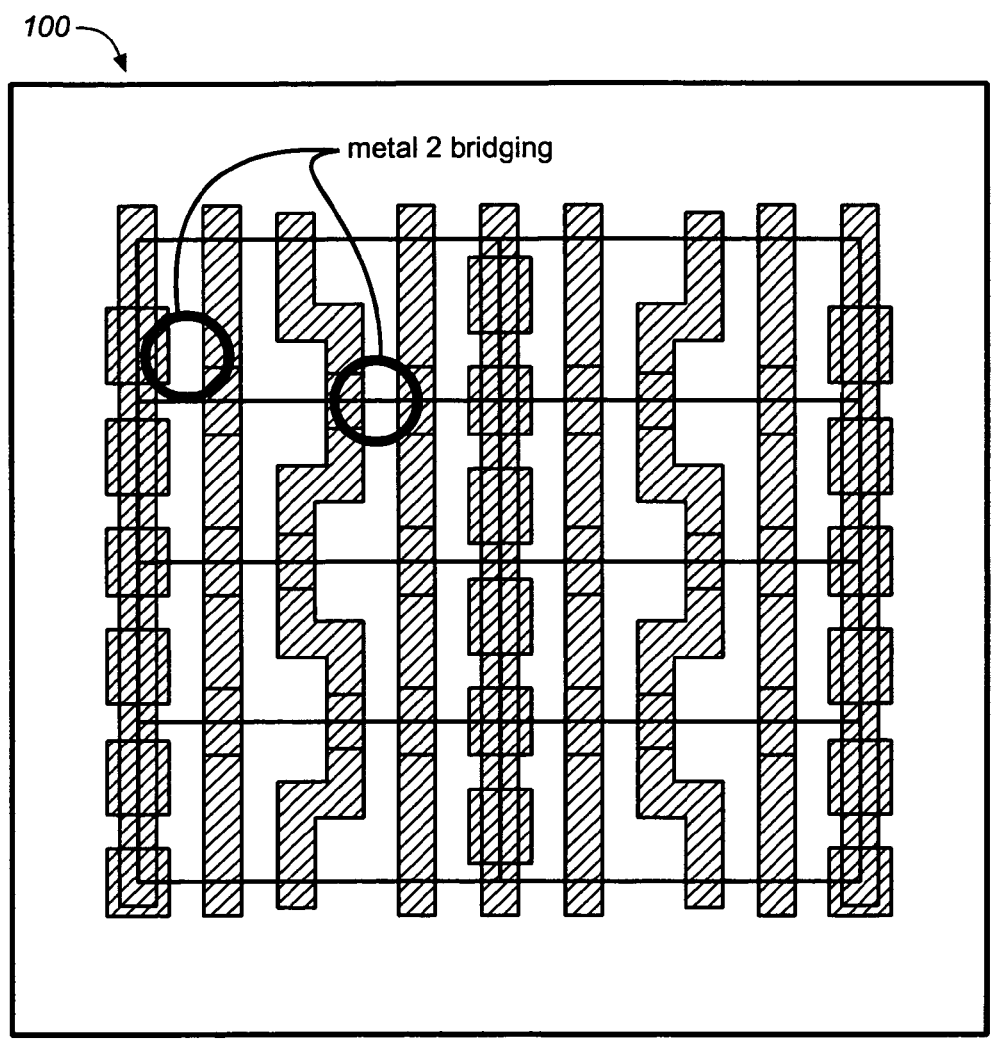
FIG._2

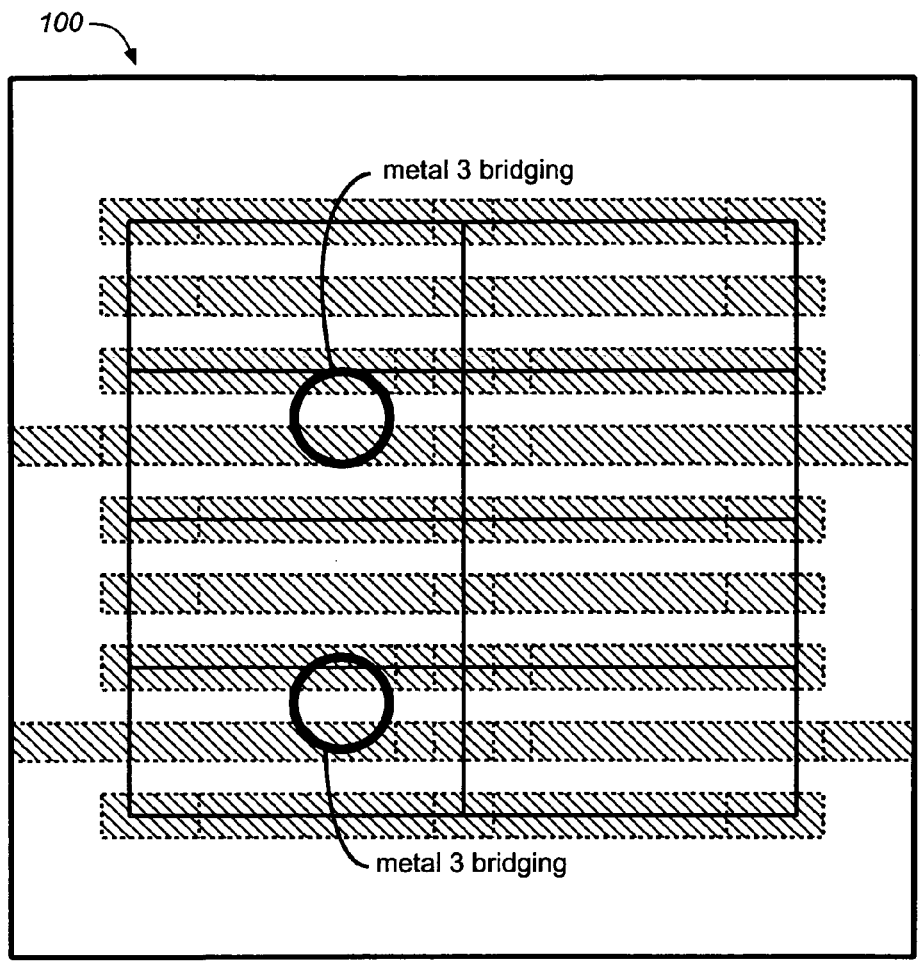
FIG._3

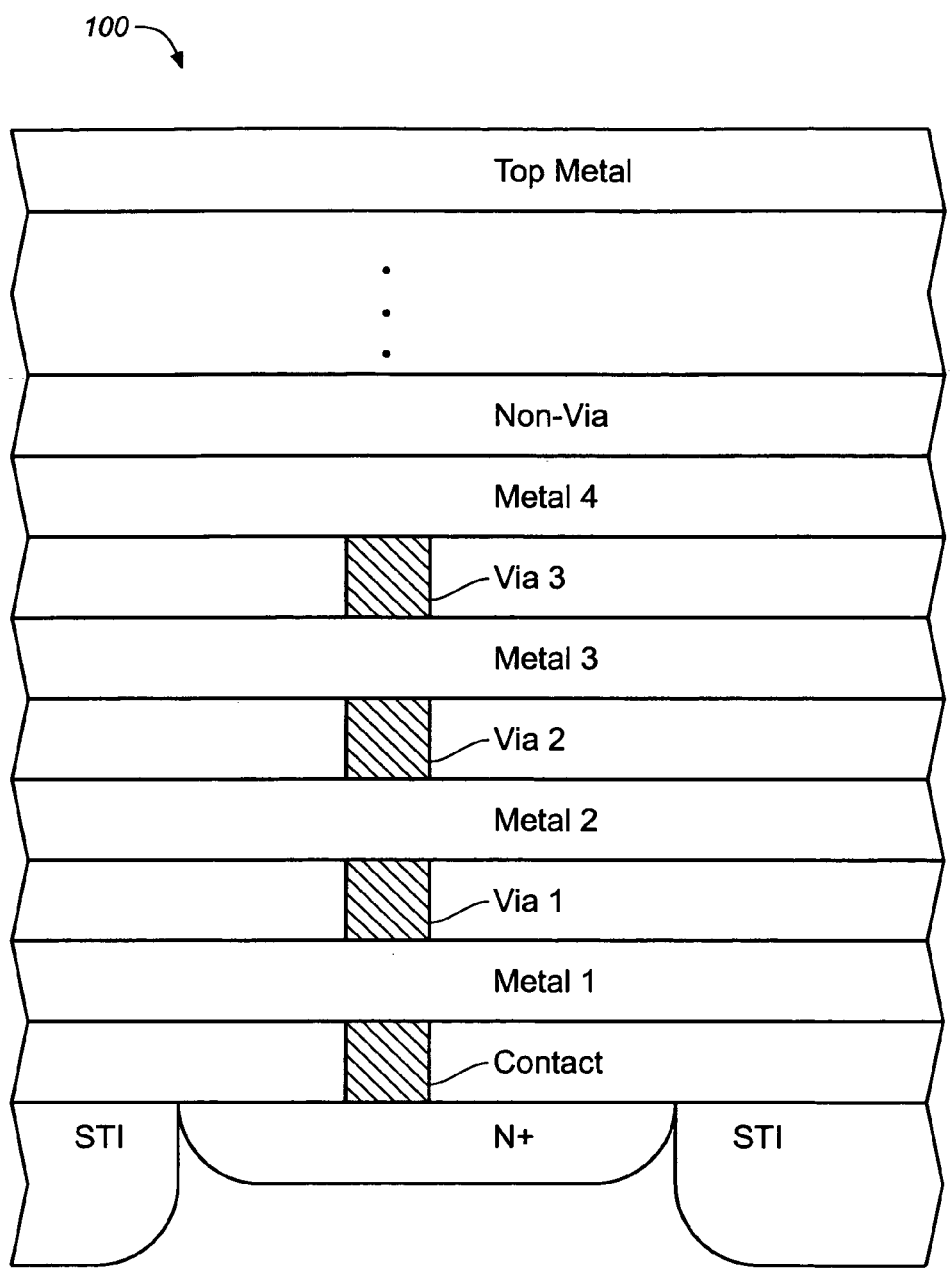
FIG._4

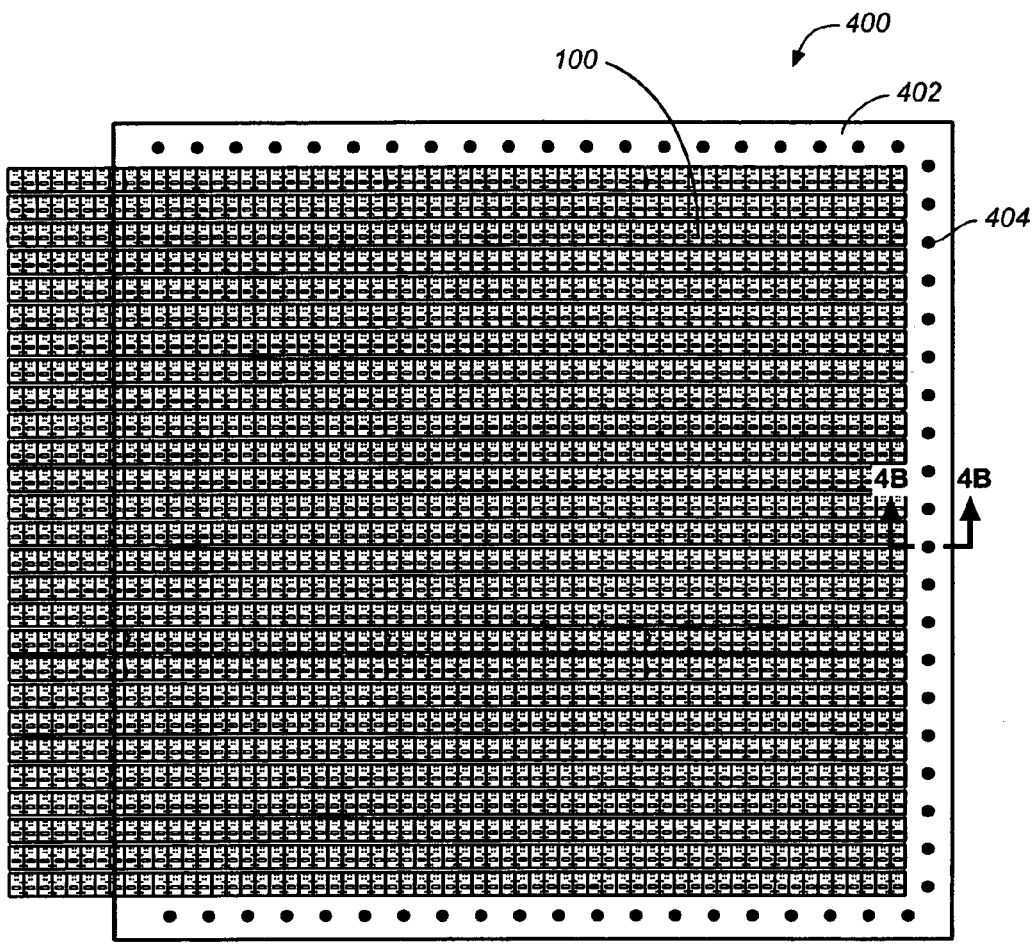
FIG._4A

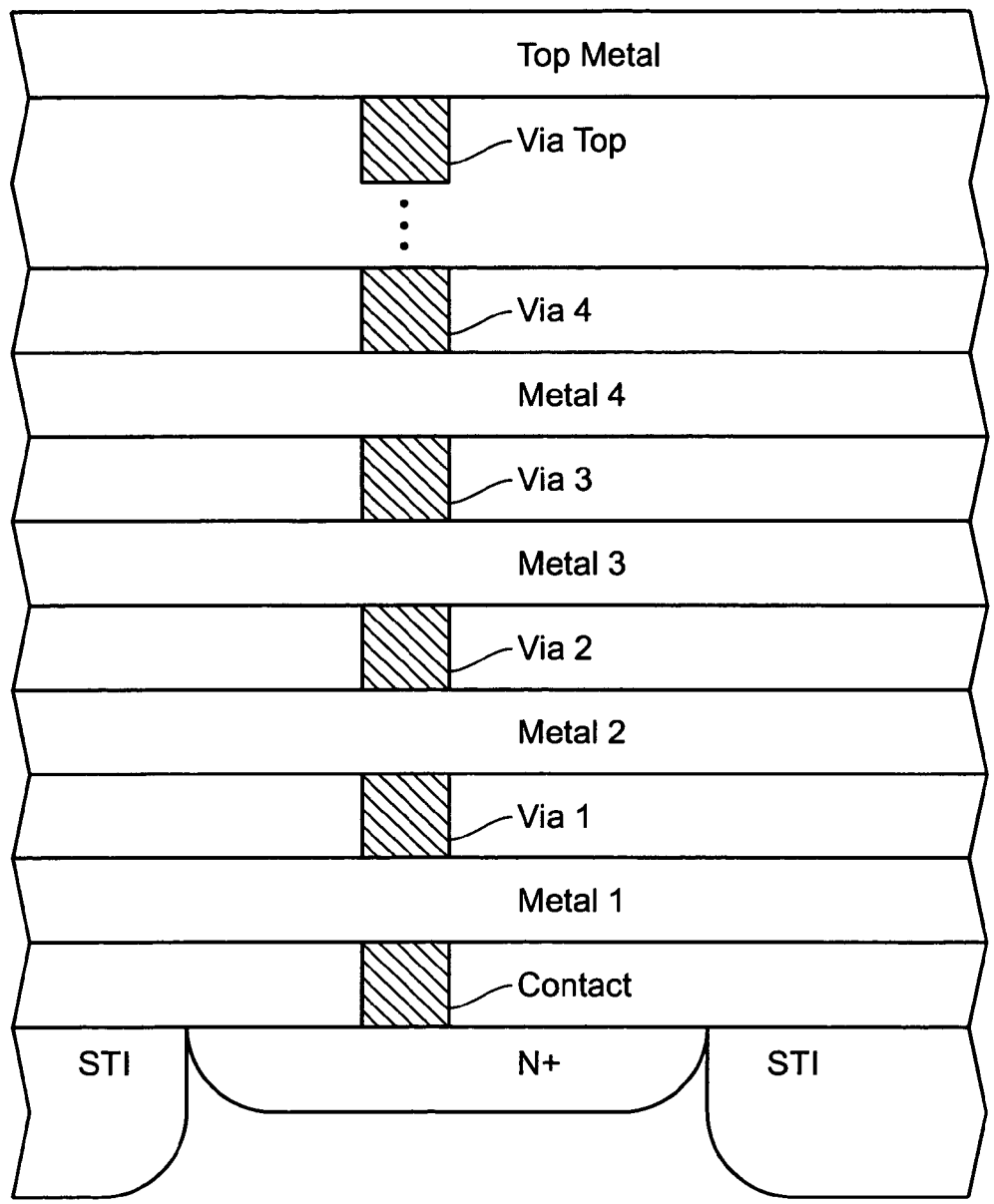
FIG._4B

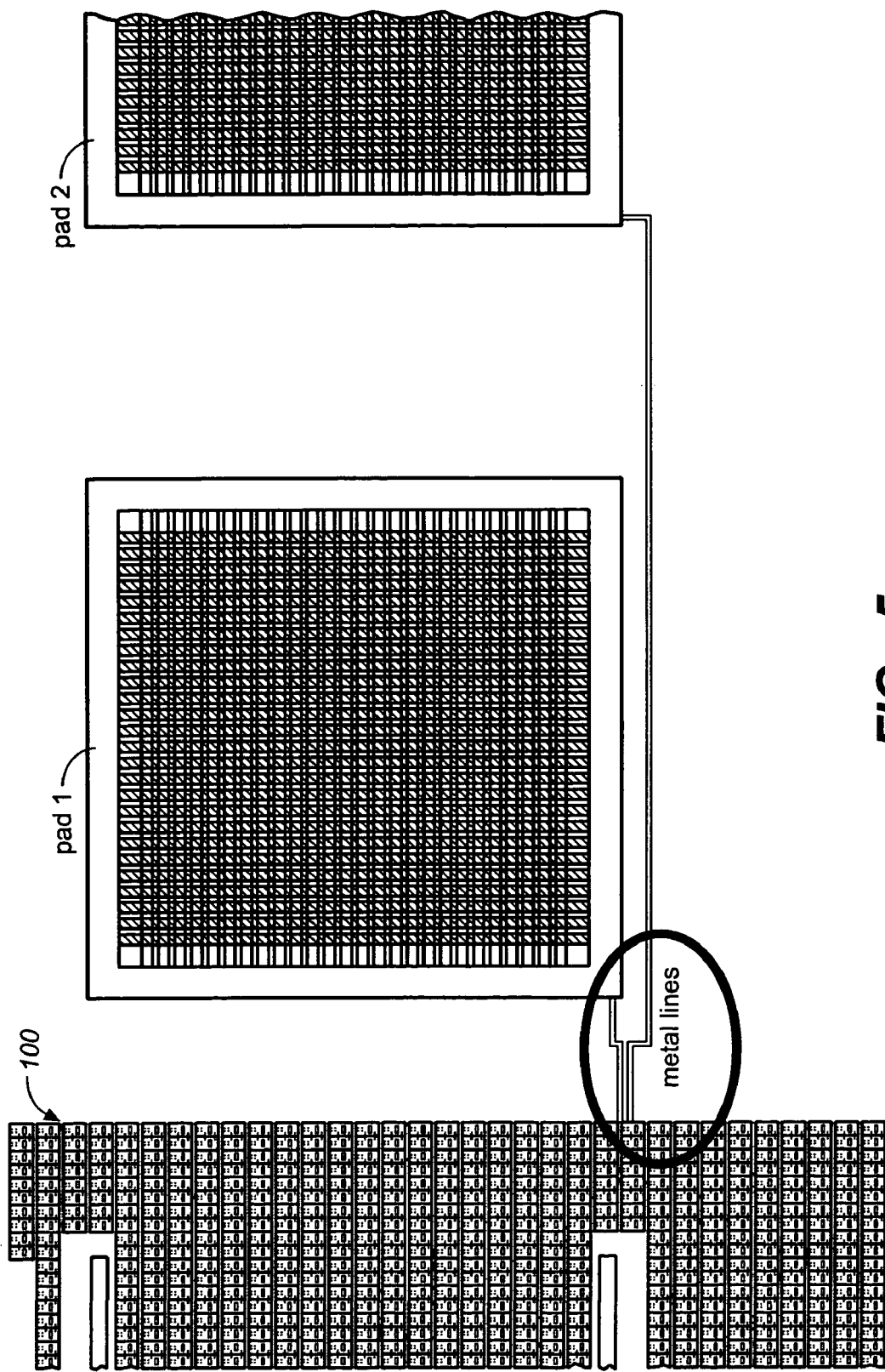
FIG._5

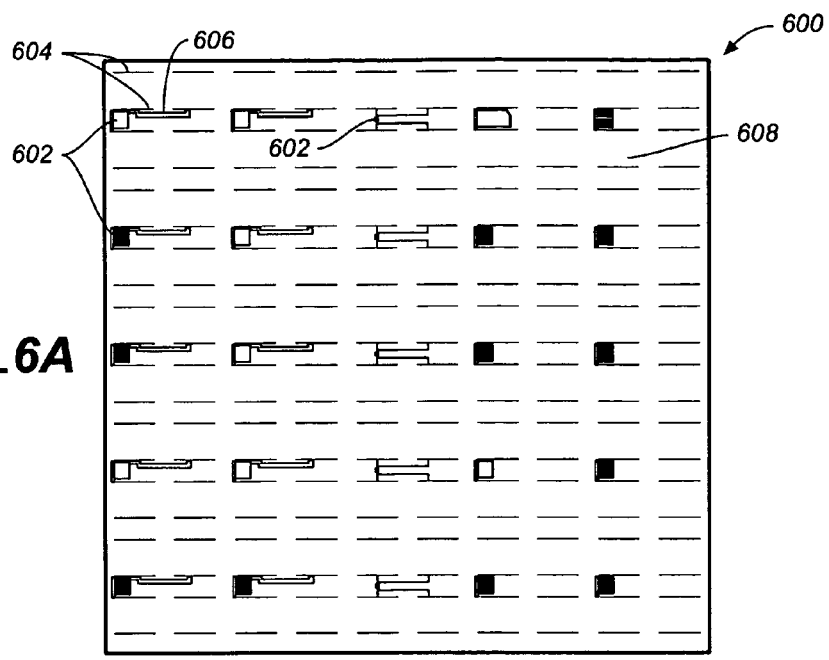
FIG._6A
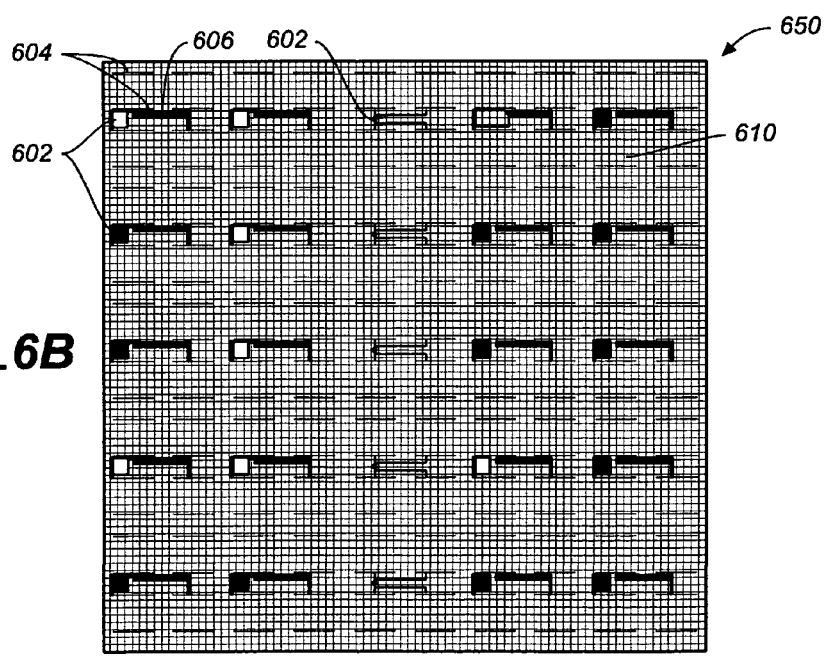
FIG._6B

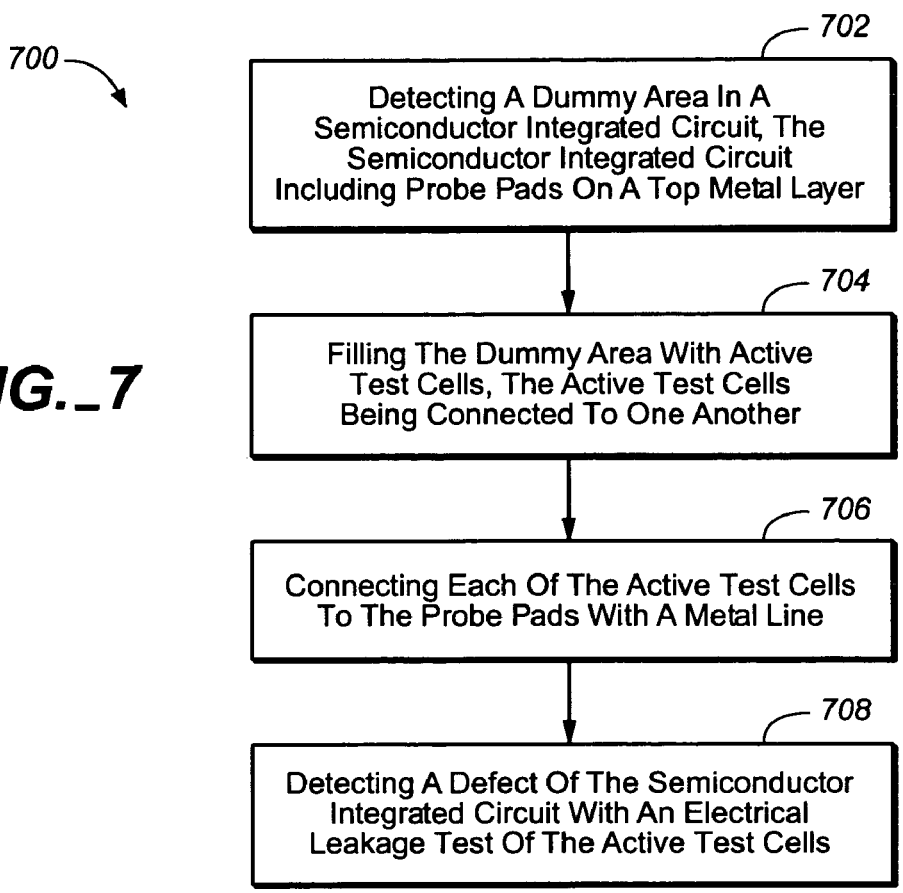
FIG._7
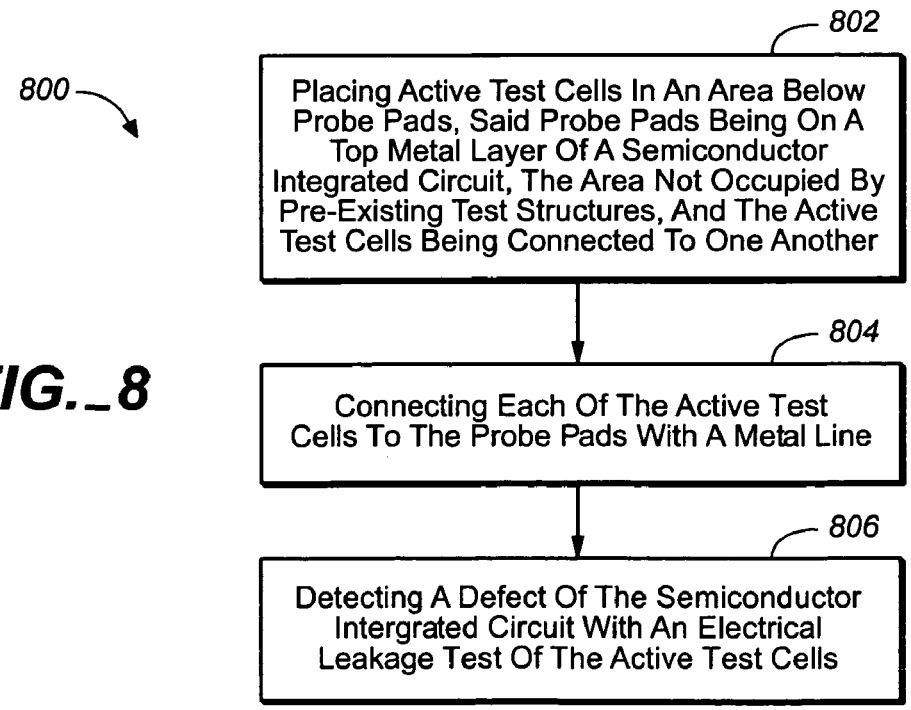
FIG._8

TEST STRUCTURES IN UNUSED AREAS OF SEMICONDUCTOR INTEGRATED CIRCUITS AND METHODS FOR DESIGNING THE SAME

CROSS-REFERENCE TO RELATED DOCUMENTS

The present patent application herein incorporates U.S. Pat. application Ser. No. 10/634,634, filed Aug. 4, 2003 by reference in its entirety.

FIELD OF THE INVENTION

This invention relates generally to semiconductor integrated circuits, and particularly to test structures in unused areas of semiconductor integrated circuits and methods for designing the same.

BACKGROUND OF THE INVENTION

In the semiconductor integrated circuit (IC) industry, there is a continuing demand for higher circuit packing densities. This demand of increased packing densities has led the semiconductor industry to develop new materials and processes to achieve sub-micron device dimensions. Manufacturing IC's at such minute dimensions adds more complexity to circuits, and the demand for improved methods to inspect IC's in various stages of their manufacture is ever present.

Although inspection of such products at various stages of manufacture is very important and may significantly improve production yield and product reliability, the increased complexity of IC's increases the cost of such inspections, both in terms of expense and time. However, if a defect can be detected early in production, the cause of the defect can be determined and corrected before a significant number of defective IC's are manufactured.

In order to overcome the problems posed by defective IC's, IC manufacturers sometimes fabricate semiconductor defect test structures (test structures). Such test structures are dedicated to defect analysis. The test structures are fabricated such that they are sensitive to defects that occur in IC product, but are designed so that the presence of defects is more readily ascertained. Such test structures are often constructed on the same semiconductor substrate as the IC products. One place to hold test structures is the scribe line. A scribe line is an area at the edge of the die where the die will be separated from each other by a diamond saw. Since the scribe line occupies a very small area, the scribe line can only hold a very limited number of test structures. Furthermore, since the test structures need probing when they are tested, most of the scribe lines are occupied by probe pads, which are located on a top metal layer of a chip.

With the development of deep sub-micron technology, there exists a need to place more test structures in both a test chip and a product chip such as RapidChip™ developed by LSI Logic Corporation, and the like, since previous Q-chip (Qualification-chip) qualification cannot guarantee the later tape-out being successful as well. However, real estate in a semiconductor integrated circuit is precious and limited. Thus, it would be desirable to provide a method and apparatus for placing more test structures in a semiconductor integrated circuit.

SUMMARY OF THE INVENTION

The present invention is directed to test structures in unused areas of semiconductor integrated circuits and methods for designing the same. In a first aspect of the present invention, a method for placing test structures in a semiconductor integrated circuit includes: (a) detecting a dummy area in a semiconductor integrated circuit, the semiconductor integrated circuit including probe pads on a top metal layer; (b) filling the dummy area with active test cells, the active test cells being connected to one another; and (c) connecting each of the active test cells to the probe pads with a metal line.

In an additional aspect of the present invention, an apparatus for placing test structures in a semiconductor integrated circuit includes: (a) means for detecting a dummy area in a semiconductor integrated circuit, the semiconductor integrated circuit including probe pads on a top metal layer; (b) means for filling the dummy area with active test cells, the active test cells being connected to one another; and (c) means for connecting each of the active test cells to the probe pads with a metal line.

In another aspect of the present invention, a method for placing test structures in a semiconductor integrated circuit includes: (a) placing active test cells in an area below probe pads, the probe pads being on a top metal layer of a semiconductor integrated circuit, the area not occupied by pre-existing test structures, and the active test cells being connected to one another; and (b) connecting each of the active test cells to the probe pads with a metal line.

In a further aspect of the present invention, an apparatus for placing test structures in a semiconductor integrated circuit includes: (a) means for placing active test cells in an area below probe pads, the probe pads being on a top metal layer of a semiconductor integrated circuit, the area not occupied by pre-existing test structures, and the active test cells being connected to one another; and (b) means for connecting each of the active test cells to the probe pads with a metal line.

In still a further aspect of the present invention, a semiconductor integrated circuit includes (a) probe pads on a top metal layer; and (b) active test cells in at least one of an area below the probe pads and a dummy area of the semiconductor integrated circuit, the area below the probe pads being not occupied by pre-existing test structures, wherein the active test cells are connected to one another, and each of the active test cells is connected to the probe pads with a metal line.

It is to be understood that both the foregoing general description and the following detailed description are exemplary and explanatory only and are not restrictive of the invention as claimed: The accompanying drawings, which are incorporated in and constitute a part of the specification, illustrate an embodiment of the invention and, together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a top plan view of an active test cell in accordance with an exemplary embodiment of the present invention, where only poly, contact, and metal 1 layers are shown;

FIG. 2 is a top plan view of the active test cell shown in FIG. 1, where only the metal 2 layer is shown;

FIG. 3 is a top plan view of the active test cell shown in FIG. 1, where only the metal 3 layer is shown;

FIG. 4 is a partial cross sectional view of the active test cell shown in FIG. 1;

FIGS. 4A and 4B show a probe pad including pad rails, where active test cells are placed inside the pad rails in accordance with an exemplary embodiment of the present invention;

FIG. 5 shows that an active test cell is connected to probe pads with metal lines for electrical measurement in accordance with an exemplary embodiment of the present invention;

FIG. 6A shows a semiconductor integrated circuit wherein the unused area is not filled with active test cells;

FIG. 6B shows a semiconductor integrated circuit wherein the unused area is filled with active test cells in accordance with an exemplary embodiment of the present invention;

FIG. 7 is a flowchart of a method for placing test structures in a semiconductor integrated circuit in accordance with an exemplary embodiment of the present invention; and FIG. 8 is a flowchart of a method for placing test structures in a semiconductor integrated circuit in accordance with another exemplary embodiment of the present invention.

DETAILED DESCRIPTION OF THE INVENTION

Reference will now be made in detail to the presently preferred embodiments of the invention, examples of which are illustrated in the accompanying drawings.

With the development of deep sub-micron technology, there exists a need to place more test structures in both a test chip and a product chip such as RapidChip™ developed by LSI Logic Corporation, and the like, since previous Q-chip (Qualification-chip) qualification cannot guarantee the later tape-out being successful as well. However, real estate in a semiconductor integrated circuit is precious and limited. Accordingly, the present invention discloses a method and apparatus for placing more test structures in a semiconductor integrated circuit by using unused areas in the semiconductor integrated circuit.

The present invention identifies two areas in a semiconductor integrated circuit to place more test structures for monitoring the semiconductor design and fabrication process. The first is a dummy area on a semiconductor chip. The term "dummy area," throughout the present application, is an unused area that is conventionally filled with dummy cells to meet the design rule requirements to ensure the quality of chip processing. A dummy area may be located in the scribe line, between functional blocks on the chip, or the like. However, the dummy cells cannot be used to monitor the semiconductor design and fabrication process. The second is an area below the probe pad in the semiconductor integrated circuit. The probe pad is conventionally used to connect silicon to the test equipment, or the like. The probe pad connects the top metal to all lower metal layers and silicon. Conventionally, the area below the probe pad is filled with metal layers and vias. The present invention discloses a method and apparatus for placing test structures in a semiconductor integrated circuit by using the dummy area and the area below the pad area in the semiconductor integrated circuit.

FIG. 1 is a top plan view of an active test cell 100 in accordance with an exemplary embodiment of the present invention, where only poly, contact, and metal 1 layers are shown. FIG. 2 is a top plan view of the active test cell 100 shown in FIG. 1, where only the metal 2 layer is shown; and FIG. 3 is a top plan view of the active test cell 100 shown in FIG. 1, where only the metal 3 layer is shown. As shown, the active test cell 100 may be used to detect any of the following defects: PN junction leakage, poly to poly bridging, poly to contact bridging, contact to contact bridging, contact to metal 1 bridging, metal 1 to metal 1 bridging, metal 2 to metal 2 bridging, metal 3 to metal 3 bridging, and the like. The active test cell 100 may be used to test the most critical layers such as island, poly, contact, metal 1, and the like during the IC processing. Most defects affect the critical layers more than other layers. Thus, in a preferred embodiment, the metal 4 layer of the active test cell 100 is not connected to any metal layer above the metal 4 layer via a via layer (FIG. 4), where STI stands for shallow trench isolation. Preferably, the active test cell 100 is a standard production cell such as a SRAM cell, and the like since the SRAM cell usually requires stringent design rules, is most sensitive to the impact of a defect, and is used for almost every semiconductor chip and product. The active test cells 100 may be connected to one another to form a test array in order to catch the IC process defect. The active test cell 100 in the test array may be connected to probe pads with metal lines for electrical measurement in accordance with an exemplary embodiment of the present invention (FIG. 5). The active test cells 100 may be placed in an unused area of a semiconductor integrated circuit such as a test chip, a standard chip, and the like to detect a defect of the semiconductor integrated circuit. The unused area may include a dummy area and an area below the probe pad in the semiconductor integrated circuit.

FIGS. 4A and 4B show a probe pad 400 including pad rails 402, where the active test cells 100 shown in FIGS. 1 and 4 are placed inside the pad rails 402 in accordance with an exemplary embodiment of the present invention. The probe pad 400 includes a top metal layer (not shown) for probing purposes and the pad rails (edges) 402 which include vias 404. Conventionally, the area below the probe pad 400 is filled with metal layers and vias. In a preferred embodiment of the present invention, the area directly below the pad rails 402 are still filled with metal layers and vias for connecting the probe pad to lower metal layers. However, the area below the probe pad 400 which is inside the pad rails 402 is filled with the active test cells 100. Since the pad rails 402 is very narrow comparing to the whole probe pad dimension, the present invention thus may provide a substantially large test area for placing test structures. For example, the area directly below the pad rails 402 may be only 8% of the total area below the probe pad 400. Thus, almost 80% of the total area below the probe pad 400 may be used to place test structures (after deducting the spacing required between the pad rails 402 and the active test cells 100).

FIG. 6A shows a semiconductor integrated circuit 600 wherein the unused area 608 below probe pads is not filled with active test cells. The semiconductor integrated circuit 600 may include the metal 1 layer 606 and pre-existing test structures 602 positioned between pad rails 604. FIG. 6B shows a semiconductor integrated circuit 650 wherein the unused area below probe pads is filled with active test cells in accordance with an exemplary embodiment of the present invention. The semiconductor integrated circuit 650 may be obtained after placing the active test cells 100 shown in FIGS. 1 and 4 in the unused area 608 of the semiconductor integrated circuit 600 shown in FIG. 6A. As shown in FIG. 6B, the active test cells 100 may form a large test array 610 to occupy the unused area and to detect a defect of the semiconductor processing of the semiconductor integrated circuit 650. For modern semiconductor processing, some defects are subtle and can no longer be caught by a small test array with a size of 10,000 cells. Thus, a larger test array is needed to show the occurrence of the defects in the process. The present invention may provide such a large test array.

FIG. 7 is a flowchart of a method or process 700 for placing test structures in a semiconductor integrated circuit in accordance with an exemplary embodiment of the present invention. The process 700 may start with a step 702 in which a dummy area in a semiconductor integrated circuit including probe pads on a top metal layer is detected. This may be automatically performed using a script. The semiconductor integrated circuit may be a test chip, a product chip, or the like. The detected dummy area may be filled with active test cells which are connected to one another (preferably seamlessly) 704. This may also be automatically performed using a script. The active test cell may be the active test cell 100 shown in FIGS. 1 and 4. Preferably, the active test cell is a standard production cell such as a SRAM cell and the like. The active test cell may include metal 4 and layers below metal 4, where metal 4 is not connected to a metal layer above metal 4 via a via layer. The active test cells may form a large test array for detecting a defect of the semiconductor processing of the semiconductor integrated circuit. Each of the active test cells is connected to the probe pads with a metal line 706. A defect of the semiconductor integrated circuit may be detected with an electrical leakage test of the active test cells 708.

FIG. 8 is a flowchart of a method or process 800 for placing test structures in a semiconductor integrated circuit in accordance with another exemplary embodiment of the present invention. The process 800 may start with a step 802 in which active test cells are placed in an area below probe pads, where the probe pads are on a top metal layer of a semiconductor integrated circuit, the area is not occupied by pre-existing test structures, and the active test cells are connected to one another (preferably seamlessly). This may be automatically performed using a script. The semiconductor integrated circuit may be a test chip, a product chip, or the like. The active test cell may be the active test cell 100 shown in FIGS. 1 and 4. Preferably, the active test cell is a standard production cell such as a SRAM cell and the like. The active test cell may include metal 4 and layers below metal 4, where metal 4 is not connected to a metal layer above metal 4 via a via layer. The active test cells may form a large test array for detecting a defect of the semiconductor processing of the semiconductor integrated circuit. Each of the active test cells is connected to the probe pads with a metal line 804. A defect of the semiconductor integrated circuit may be detected with an electrical leakage test of the active test cells 806.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for placing test structures in a semiconductor integrated circuit, comprising:
    detecting a dummy area in a semiconductor integrated circuit, said semiconductor integrated circuit including probe pads on a top metal layer;
    filling said dummy area with active test cells, said active test cells being connected to one another; and
    connecting each of said active test cells to said probe pads with a metal line.

2. The method of claim 1, wherein said active test cells are SRAM cells.

3. The method of claim 1, wherein said active test cells comprise metal 4, said metal 4 being not connected to a metal layer above said metal 4 via a via layer.

4. The method of claim 1, wherein said semiconductor integrated circuit is a test chip or a product chip.

5. The method of claim 1, further comprising detecting a defect of said semiconductor integrated circuit with an electrical leakage test of said active test cells.

6. The method of claim 1, further comprising placing said active test cells in an area below said probe pads, said area not occupied by pre-existing test structures.

7. An apparatus for placing test structures in a semiconductor integrated circuit, comprising:
    means for detecting a dummy area in a semiconductor integrated circuit, said semiconductor integrated circuit including probe pads on a top metal layer;
    means for filling said dummy area with active test cells, said active test cells being connected to one another; and
    means for connecting each of said active test cells to said probe pads with a metal line.

8. The apparatus of claim 7, wherein said active test cells are SRAM cells.

9. The apparatus of claim 7, wherein said active test cells comprise metal 4, said metal 4 being not connected to a metal layer above said metal 4 via a via layer.

10. The apparatus of claim 7, wherein said semiconductor integrated circuit is a test chip or a product chip.

11. The apparatus of claim 7, further comprising means for detecting a defect of said semiconductor integrated circuit with an electrical leakage test of said active test cells.

12. The apparatus of claim 7, further comprising means for placing said active test cells in an area below said probe pads, said area not occupied by pre-existing test structures.

13. A method for placing test structures in a semiconductor integrated circuit, comprising:
    placing active test cells in an area below probe pads, said probe pads being on a top metal layer of a semiconductor integrated circuit, said area not occupied by pre-existing test structures, and said active test cells being connected to one another; and
    connecting each of said active test cells to said probe pads with a metal line.

14. The method of claim 13, wherein said active test cells are SRAM cells.

15. The method of claim 13, wherein said active test cells comprise metal 4, said metal 4 being not connected to a metal layer above said metal 4 via a via layer.

16. The method of claim 13, wherein said semiconductor integrated circuit is a test chip or a product chip.

17. The method of claim 13, further comprising detecting a defect of said semiconductor integrated circuit with an electrical leakage test of said active test cells.

18. An apparatus for placing test structures in a semiconductor integrated circuit, comprising:
   means for placing active test cells in an area below probe pads, said probe pads being on a top metal layer of a semiconductor integrated circuit, said area not occupied by pre-existing test structures, and said active test cells being connected to one another; and
   means for connecting each of said active test cells to said probe pads with a metal line.

19. The apparatus of claim 18, wherein said active test cells are SRAM cells.

20. The apparatus of claim 18, wherein said active test cells comprise metal 4, said metal 4 being not connected to a metal layer above said metal 4 via a via layer.

21. The apparatus of claim 18, wherein said semiconductor integrated circuit is a test chip or a product chip.

22. The apparatus of claim 18, further comprising means for detecting a defect of said semiconductor integrated circuit with an electrical leakage test of said active test cells.

23. A semiconductor integrated circuit, comprising:
   probe pads on a top metal layer; and
   active test cells in at least one of an area below said probe pads and a dummy area of said semiconductor integrated circuit, said area below said probe pads being not occupied by pre-existing test structures,
   wherein said active test cells are connected to one another, and each of said active cells is connected to said probe pads with a metal line.

24. The semiconductor integrated circuit of claim 23, wherein said active test cells are SRAM cells.

25. The semiconductor integrated circuit of claim 23, wherein said active test cells comprise metal 4, said metal 4 being not connected to a metal layer above said metal 4 via a via layer.

26. The semiconductor integrated circuit of claim 23, wherein said semiconductor integrated circuit is a test chip or a product chip.

27. The semiconductor integrated circuit of claim 23, wherein said area below said probe pads are inside pad rails of said probe pads.

* * * * *